United States Patent
En et al.

(10) Patent No.: US 6,764,966 B1
(45) Date of Patent: Jul. 20, 2004

(54) SPACERS WITH A GRADED DIELECTRIC CONSTANT FOR SEMICONDUCTOR DEVICES HAVING A HIGH-K DIELECTRIC

(75) Inventors: William George En, Milpitas, CA (US); Arvind Halliyal, Cupertino, CA (US); Ming-Ren Lin, Cupertino, CA (US); Minh Van Ngo, Fremont, CA (US); Chih-Yuh Yang, San Jose, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 211 days.

(21) Appl. No.: 10/085,278

(22) Filed: Feb. 27, 2002

(51) Int. Cl.[7] .......................... H01L 21/28; H01L 21/44; H01L 21/469
(52) U.S. Cl. ....................... 438/785; 438/578; 438/582; 438/758
(58) Field of Search ................................ 438/578, 582, 438/758, 785

(56) References Cited

U.S. PATENT DOCUMENTS

| | | | |
|---|---|---|---|
| 5,766,969 A | * 6/1998 | Fulford et al. | 438/305 |
| 5,960,270 A | 9/1999 | Misra et al. | 438/197 |
| 6,013,553 A | 1/2000 | Wallace et al. | 438/287 |
| 6,020,024 A | 2/2000 | Maiti et al. | 427/248.1 |
| 6,063,679 A | * 5/2000 | Gardner et al. | 438/303 |
| 6,100,120 A | 8/2000 | Yu | 438/151 |
| 6,187,620 B1 | * 2/2001 | Fulford et al. | 438/230 |
| 6,207,485 B1 | * 3/2001 | Gardner et al. | 438/216 |
| 6,255,180 B1 | * 7/2001 | Smith | 438/301 |
| 6,258,680 B1 | * 7/2001 | Fulford et al. | 438/305 |
| 6,297,107 B1 | 10/2001 | Paton et al. | 438/291 |
| 6,342,453 B1 | * 1/2002 | Khandan et al. | 438/758 |
| 6,455,383 B1 | 9/2002 | Wu | 438/296 |
| 6,518,113 B1 | 2/2003 | Buynoski | 438/217 |
| 6,534,395 B2 | * 3/2003 | Werkhoven et al. | 438/627 |

OTHER PUBLICATIONS

U.S. application Ser. No. 10/097,911, filed Mar. 13, 2002 Spacer Liner for a High-K Dielectric Layer.

* cited by examiner

Primary Examiner—Alexander Ghyka
(74) Attorney, Agent, or Firm—Renner, Otto, Boisselle & Sklar, LLP

(57) ABSTRACT

A semiconductor device formed on a semiconductor substrate having an active region and a method of making the same is disclosed. The semiconductor device includes a dielectric layer interposed between a gate electrode and the semiconductor substrate. Further, the semiconductor device includes graded dielectric constant spacers formed on sidewalls of the dielectric layer, sidewalls of the gate electrode and portions of an upper surface of the semiconductor substrate. The dielectric constant of the graded dielectric constant spacers decreases in a direction away from the sidewalls of the dielectric layer.

5 Claims, 3 Drawing Sheets

SPACERS WITH A GRADED DIELECTRIC CONSTANT FOR SEMICONDUCTOR DEVICES HAVING A HIGH-K DIELECTRIC

TECHNICAL FIELD

The present invention generally relates to semiconductor devices having a dielectric layer of a high-K material. In particular, the present invention relates to spacers with a graded dielectric constant for semiconductor devices having a high-K dielectric.

BACKGROUND

A conventional field effect transistor (FET) is characterized by a vertical stack on a semiconductor substrate. The semiconductor substrate is doped with either n-type or p-type impurities to form an active region in the semiconductor substrate. The vertical stack includes a gate dielectric and a gate electrode. The gate dielectric of silicon dioxide ($SiO_2$ gate dielectric), for example, is formed on the semiconductor substrate. The gate electrode of polysilicon, for example, is formed on the gate dielectric. The gate electrode formed on the $SiO_2$ gate dielectric defines a channel interposed between a source and a drain formed within the active region of the semiconductor substrate. The source and the drain are formed by dopant impurities introduced into the semiconductor substrate. Spacers of $SiO_2$, for example, are formed on the sidewalls of the vertical stack.

A pervasive trend in modern integrated circuit manufacture is to produce semiconductor devices, e.g., FETs, having featured sizes as small as possible. Many present processes employ features, such as gate electrodes and interconnects, which have less than a 0.18 $\mu$m critical dimension. As feature sizes continue to decrease, the size of the resulting semiconductor device, as well as the interconnect between semiconductor devices, also decreases. Fabrication of smaller semiconductor devices allows more semiconductor devices to be placed on a single monolithic semiconductor substrate, thereby allowing relatively large circuit systems to be incorporated on a single, relatively small die area.

As semiconductor device feature sizes decrease, the thickness of the $SiO_2$ gate dielectric decreases as well. This decrease in $SiO_2$ gate dielectric thickness is driven in part by the demands of overall device scaling. As gate electrode widths decrease, for example, other device dimensions must also decrease in order to maintain proper device operation. Early semiconductor device scaling techniques involved decreasing all dimensions and voltages by a constant scaling factor, to maintain constant electric fields in the device as the feature size decreased. This approach has given way to more flexible scaling guidelines which account for operating characteristics of short-channel devices. A maximum value of semiconductor device subthreshold current can be maintained while feature sizes shrink. Any or all of several quantities may be decreased by appropriate amounts including $SiO_2$ gate dielectric thickness, operating voltage, depletion width and junction depth, for example.

As a result of the continuing decrease in feature size, $SiO_2$ gate dielectric thickness has been reduced so much that $SiO_2$ layers of the $SiO_2$ gate dielectrics are approaching thicknesses on the order of ten angstroms (Å). Unfortunately, thin $SiO_2$ layers may break down when subjected to an electric field, particularly $SiO_2$ layers of the gate dielectrics less than 50 angstroms (Å) thick. It is probable that even for a relatively low gate voltage of 3V, electrons can pass through such thin $SiO_2$ layers by a quantum mechanical tunneling effect. In this manner, a leakage current may undesirably form between the gate electrode and the semiconductor substrate, adversely in affecting the operability of the device. For example, the leakage current changes from $1\times10^{-12}$ angstroms/$cm^2$ to $1\times10$ angstroms/$cm^2$ for ~35 angstroms (Å) and ~15 angstroms (Å) thick $SiO_2$ layers, respectively, at gate bias of ~1V. In other words, the leakage current increases about 12 orders of magnitude for about a two-fold decrease in thickness. The exponential increase in the $SiO_2$ layer leakage current significantly affects the operation of semiconductor devices, particularly with regard to standby power, dissipation, reliability and lifetime.

One proposed solution is to replace the $SiO_2$ material of the gate dielectric with a material having a dielectric constant value higher than $SiO_2$ (high-K dielectric material will be further explained below). Using a dielectric material having a high-K for the gate dielectric would allow a higher capacitance and an electric equivalent thickness of a thinner $SiO_2$ gate dielectric to be achieved while maintaining or increasing the physical thickness of the gate dielectric. For example, an aluminum oxide ($Al_2O_3$) layer with a K of 9.6 and a physical thickness of 62.5 angstroms (Å) is substantially electrically equivalent to a $SiO_2$ layer (K=3.9) having a physical thickness of 25 angstroms (Å). Thus, the gate dielectric of $Al_2O_3$ would have an electrical equivalent thickness of 25 angstroms (Å) of $SiO_2$, but have a physical thickness of 62.5 angstroms (Å). Therefore, the gate dielectric can be made electrically thin while being formed of a physically thicker layer. As a result, further device scaling can be achieved.

However, the $SiO_2$ spacers of a FET with the high-K gate dielectric may form a fixed charge in the $SiO_2$ spacers near an interface adjacent the gate dielectric. The fixed charge may form due to a tunneling of electrons into the spacers near the interface of the gate dielectric and the high-K gate dielectric due to the difference in the dielectric constant of the materials. Further, the $SiO_2$ spacers may entrap some electrons due to, for example, dangling bonds. As a result, a net negative charge density may form in the $SiO_2$ spacers as described above. As the trapped charge accumulates with time, the operation of the device will be degraded. A fixed charge may also be formed in a dielectric material having a lower dielectric constant during the processing of the semiconductor device.

Therefore, there exists a strong need in the art for a spacer with a graded dielectric constant in order to inhibit the formation of the fixed charge in the spacer of a semiconductor device having a high-K dielectric material.

SUMMARY OF THE INVENTION

A spacer having a graded dielectric constant may be formed which will inhibit the formation of a fixed charge in the spacer near the interface of a gate dielectric of a high-K dielectric material of a semiconductor device. The spacer would include at least one layer of a high-K material (e.g., a first layer) and at least one layer of a material having a dielectric constant less than the first layer (e.g., a second layer). The first layer of the spacer would be of a high-K material having a dielectric constant equal to or greater than the dielectric constant of the high-K gate dielectric. The second layer, and any subsequent layer, of the spacer would be of a dielectric constant material having a dielectric constant less than the preceding layer. The first layer of high-K material adjacent the high-K gate dielectric will reduce the probability of the electrons tunneling into the spacer and becoming entrapped by the first layer of the spacer adjacent the gate dielectric. Thus, the formation of a fixed charge found in a conventional $SiO_2$ spacer can be removed to a region of the graded dielectric constant spacer in which the fixed charge will not affect the operability of the semiconductor device. Therefore, the operability of the semiconductor device can be improved through further device scaling using high-K materials for gate dielectrics resulting in smaller, faster, more reliable devices.

According to one aspect of the invention, the invention is a semiconductor device formed on a semiconductor substrate having an active region. The semiconductor device includes a dielectric layer interposed between a gate electrode and the semiconductor substrate. Further, the semiconductor device includes graded dielectric constant spacers formed on sidewalls of the dielectric layer, sidewalls of the gate electrode and portions of an upper surface of the semiconductor substrate. The dielectric constant of the graded dielectric constant spacers decreases in a direction away from the sidewalls of the dielectric layer.

According to one aspect of the invention, the invention is a semiconductor device formed on a semiconductor substrate having an active region. The semiconductor device includes a gate dielectric layer disposed on the semiconductor substrate. A gate electrode is formed on the gate dielectric layer wherein the gate electrode defines a channel interposed between a source and a drain formed within the active region of the semiconductor substrate. Further, the semiconductor device includes graded dielectric constant spacers formed on sidewalls of the gate electrode, sidewalls of the gate dielectric layer and portions of an upper surface of the semiconductor substrate. The dielectric constant of the graded dielectric constant spacers decreases in value in a direction away from the gate dielectric layer.

According to another aspect of the invention, the invention is a method of fabricating a semiconductor device formed on a semiconductor substrate having an active region. The method includes the step of forming a gate dielectric layer on the semiconductor substrate. Further, the method includes the step of forming a source and a drain within the active region of the semiconductor substrate. The method further includes the steps of forming a gate electrode on the gate dielectric layer wherein the gate electrode defines a channel interposed between the source and the drain. Additionally, the method includes the step of forming graded dielectric constant spacers on sidewalls of the gate electrode, sidewalls of the gate dielectric layer and portions of an upper surface of the semiconductor substrate. The dielectric constant of the graded dielectric constant spacers decreases in value in a direction away from the gate dielectric layers.

DETAILED DESCRIPTION

Figure 1:
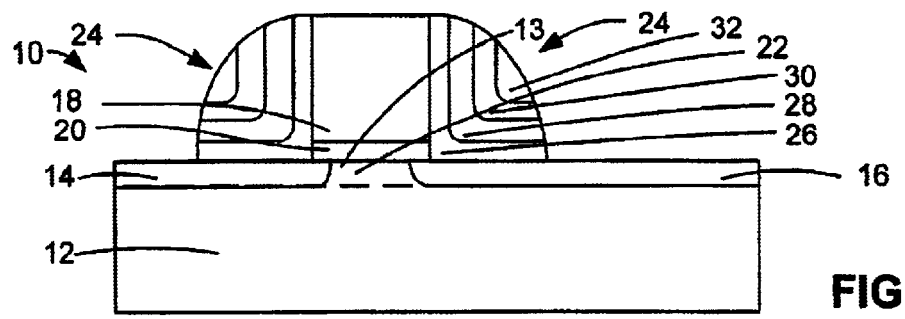
FIG. 1 is a schematic cross-sectional view of a semiconductor device including a spacer with a graded dielectric constant in accordance with the present invention.

In the detailed description that follows, identical components have been given the same reference numerals, regardless of whether they are shown in different embodiments of the present invention. To illustrate the present invention in a clear and concise manner, the drawings may not necessarily be to scale and certain features may be shown in somewhat schematic form.

The present invention is described hereinbelow in terms of a common semiconductor device formed on a semiconductor substrate. Specifically, a field effect transistor (FET) formed on a semiconductor substrate is described. However, the present invention is not limited to this illustrative embodiment. The present invention may be applied to any semiconductor device in which a high-K dielectric layer is used. For example, the present invention may be used with a gate dielectric in a FLASH memory cell. Alternatively, the present invention may be used with an intergate dielectric layer in a gate electrode EEPROM FLASH memory device. In another embodiment, the present invention may be used with an ONO layer in a SONOS-type FLASH memory device, such as the Mirror-Bit™ SONOS-type FLASH memory device available from AMD. Thus, it is to be understood that the present invention is not limited to the specific illustrative embodiments described below.

The present invention relates to a semiconductor device and to a method making the semiconductor device. The semiconductor device includes a spacer having layers of dielectric material. The spacer begins with a layer of material having a dielectric constant greater than or equal to the dielectric constant of a gate dielectric of the semiconductor device. The spacer ends with a layer of material having a dielectric constant less than the preceding layer.

Thus, in an exemplary embodiment the present invention relates to a semiconductor device having graded dielectric constant spacers. The semiconductor device includes a semiconductor substrate and a FET formed thereon. The FET is characterized by a vertical stack. The vertical stack includes a gate dielectric and a gate electrode. Additionally, graded dielectric constant spacers are formed on the sidewalls of the vertical stack. The graded dielectric constant spacers include and/or are formed from sub-layer of dielectric materials deposited on the vertical stack. Together the sub-layers form the graded dielectric spacer having at least one sub-layer of a first dielectric material having a dielectric constant greater than or equal to the dielectric constant of a high-K gate dielectric. In this exemplary embodiment, each dielectric material of a subsequent layer has a dielectric constant less than the preceding dielectric material. The graded dielectric constant of the spacer moves an interface of the layer in which electrons become entrapped away from an interface of the gate dielectric and the graded dielectric constant spacer. Thus, the graded dielectric constant spacers are an improved spacer for semiconductor devices with high-K dielectrics.

FIG. 1 shows a semiconductor device of the present invention generally designated as 10. The semiconductor device 10 comprises a semiconductor substrate 12 having an active region 13. The active region 13 may have a thickness of between 800 and 1000 angstroms (Å). A source 14 and a drain 16 are formed in the active region 13. A gate electrode 18 is formed on a gate dielectric 20. The gate dielectric 20 is formed on the semiconductor substrate 12. The gate electrode 18 defines a channel 22 between the source 14 and the drain 16. The gate dielectric 20 and the gate electrode 18 form a vertical stack characteristic of a FET. Graded dielectric constant spacers 24 are formed on the sidewalls of the vertical stack and an upper surface of the semiconductor substrate 12. The graded dielectric constant spacers 24 are formed of layers of dielectric material wherein the preceding layer has a higher dielectric constant than the subsequent layer. In this exemplary embodiment, the graded dielectric constant spacers 24 are comprised of four layers. A first layer 26 is formed on the sidewalls of the gate electrode 18, the sidewalls of the gate dielectric 20 and on the upper surface of the semiconductor substrate 12. A second layer 28 is formed on the first layer 26. A third layer 30 is formed on the second layer 28 and a fourth layer 32 is formed on the third layer 30. Isolation techniques that are known in the art may be used to electrically isolate the semiconductor device 10 from other semiconductor devices.

In the exemplary embodiment, as illustrated in FIG. 1, the channel 22 may be a p-type region and the source 14 and the drain 16 may be two N+ regions in the active region 13 of the semiconductor substrate 12. The channel 22 is interposed between the source 14 and the drain 16. Alternatively, an n-type channel could be interposed between two P+ regions. Although the source 14 and the drain 16 are shown as respective deep implant regions, it should be understood that shallow extension regions could also be formed extending from the respective deep implant regions. The active region 13 may be predoped prior to the manufacture of the gate electrode 18 of the semiconductor device 10 with p-type dopings for n-type channel devices and/or n-type dopings for p-type channel devices.

The gate dielectric 20 interposed between the gate electrode 18 and the semiconductor substrate 12 is a single layer dielectric. However, the gate dielectric 20 could be a multi-layer dielectric. The gate dielectric 20 may be made of suitable gate dielectric materials having a dielectric constant greater than $SiO_2$ (K=3.9) as will be further discussed below. In this exemplary embodiment, the gate dielectric 20 is made of $Al_2O_3$. The gate dielectric 20 may have a thickness of between 50 and 100 angstroms (Å), for example.

The gate electrode 18 may be made of typical well-known gate electrode materials, for example, polysilicon. The exemplary gate electrode 18 may have a thickness of between 750 and 1100 angstroms (Å).

The graded dielectric constant spacers 24 are made of layers of dielectric materials as described below. The exemplary graded dielectric constant spacers 24 may have total heights between 800 and 1200 angstroms (Å). The first layer 26 may be made of $Al_2O_3$ or may be made of another high-K dielectric material described below. The first layer 26 may have a thickness of between 200 and 400 angstroms (Å), for example. The second layer 28 may be made of a high-K material with a dielectric constant greater than that of $SiO_2$, but less than the dielectric constant of the first layer 26. In an exemplary embodiment, the second layer 28 may be $Si_3N_4$. The exemplary second layer 28 may have a thickness of between 200 and 400 angstroms (Å). The third layer 30 may be made of a high-K dielectric material having a dielectric constant greater than that of $SiO_2$, but less than the dielectric constant of the second layer 28. In an exemplary embodiment, the third layer 30 may be $SiO_xN_y$. The exemplary third layer 30 may have a thickness of between 200 and 400 angstroms (Å). The fourth layer 32 may be made of a dielectric material having a dielectric constant greater than or equal to that of $SiO_2$, as well as less than the dielectric constant of the third layer 30. In an exemplary embodiment, the fourth layer 32 may be $SiO_2$. The exemplary fourth layer 32 may have a thickness of between 200 and 400 angstroms (Å).

Not shown in FIG. 1 are additional parts of a working semiconductor device, such as electrical conductors, protective coatings and other parts of the structure which would be included in a complete, working semiconductor device. These additional parts are not necessary to the present invention, and for simplicity and brevity are neither shown nor described. Nevertheless, how such parts could be added will be easily understood by those of skill in the art.

In one embodiment, the semiconductor substrate 12 is a bulk silicon semiconductor substrate. In one embodiment, the semiconductor substrate 12 is a silicon-on-insulator semiconductor substrate. In another embodiment, the semiconductor substrate 12 is a p-doped silicon semiconductor substrate. Suitable semiconductor substrates include, for example, bulk silicon semiconductor substrates, silicon-on-insulator (SOI) semiconductor substrates, silicon-on-sapphire (SOS) semiconductor substrates, and semiconductor substrates formed of other materials known in the art. The present invention is not limited to any particular type of semiconductor substrate.

As used herein, the term "high-K dielectric" refers to a dielectric material having a K greater than $SiO_2$ (K=3.9). Such high-K dielectric materials include, for example, silicon oxynitride ($SiO_xN_y$), which has a K of about 4–8 depending on the relative content of oxygen and nitrogen; silicon nitride ($Si_3N_4$), which has a K of about 6–9; aluminum oxide ($Al_2O_3$), which has a K of about 10; composite materials such as hafnium silicate, which has a K of about 14; hafnium silicon oxynitride, which has a K of about 16, depending on the relative content of oxygen and nitrogen;

hafnium silicon nitride, which has a K of about 18; $HfO_2$, $ZrO_2$, $Ta_2O_5$ and others, some of which are identified more fully below.

Approximate K-values or, in some cases, a range of K-values, are shown below in Table 1 for several exemplary dielectric materials. It is understood that the present invention is not limited to the specific dielectric materials disclosed herein, but may include any appropriate dielectric materials which are known and are compatible with the remaining elements of the semiconductor device with which the dielectric materials are to be used.

TABLE 1

| Dielectric Material | Approximate Dielectric Constant (K) (Relative Permittivity) |
|---|---|
| silicon nitride, $Si_3N_4$ | 6–9 |
| silicon oxynitride, $SiO_xN_y$ | 4–8 |
| aluminum oxide | 10 |
| zirconium silicate | 12 |
| hafnium silicate | 15 |
| lanthanum oxide, $La_2O_3$ | 20–30 |
| hafnium oxide, $HfO_2$ | 40 |
| zirconium oxide, $ZrO_2$ | 25 |
| cerium oxide, $CeO_2$ | 26 |
| bismuth silicon oxide, $Bi_4Si_2O_{12}$ | 35–75 |
| titanium dioxide, $TiO_2$ | 30 |
| tantalum oxide, $Ta_2O_5$ | 26 |
| tungsten oxide, $WO_3$ | 42 |
| yttrium oxide, $Y_2O_3$ | 20 |
| $LaAlO_3$ | 25 |
| BST ($Ba_{1-x}Sr_xTiO_3$) | ~20—200 |
| $PbTiO_3$ | ~20—200 |
| $BaSTiO_3$ | ~20—200 |
| $SiTiO_3$ | ~20—200 |
| $PbZrO_3$ | ~20—200 |
| PST ($PbSc_xTa_{1-x}O_3$) | ~200—3000 |
| PZN ($PbZn_xNb_{1-x}O_3$) | ~200—5000 |
| PZT ($PbZr_xTi_{1-x}O_3$) | ~100—1000 |
| PMN ($PbMg_xNb_{1-x}O_3$) | ~200—5000 |

It is noted that the K-values, or relative permittivity, for dielectric materials may vary to some degree depending on the exact nature of the dielectric material and on the process used to deposit the material. Thus, for example, differences in purity, crystallinity and stoichiometry, may give rise to variations in the exact K-value determined for any particular dielectric material.

As used herein, when a material is referred to by a specific chemical name or formula, the material may include non-stoichiometric variations of the stoichiometrically exact formula identified by the chemical name. For example, tantalum oxide, when stoichiometrically exact, has the chemical formula $Ta_2O_5$. As used herein, the term "tantalum oxide" may include variants of stoichiometric $Ta_2O_5$, which may be referred to as $Ta_xO_y$, in which either of x or y vary by a small amount. For example, in one embodiment, x may vary from about 1.5 to about 2.5, and y may vary from about 4.5 to about 5.5. In another embodiment, x may vary from about 1.75 to about 2.25, and y may vary from about 4.0 to about 6.0. Such variations from the exact stoichiometric formula fall within the definition of tantalum oxide. Similar variations from exact stoichiometry are included when the chemical formula for a compound is used. For example, again using tantalum oxide as an example, when the formula $Ta_2O_5$ is used, $Ta_xO_y$ as defined above, is included within the meaning. Thus, in the present disclosure, exact stoichiometry is intended only when such is explicitly so stated. As will be understood by those of skill in the art, such variations may occur naturally, or may be sought and controlled by selection and control of the conditions under which materials are formed.

Here and in all numerical values in the specification and claims, the limits of the ranges and ratios may be combined.

The present invention further relates to a method of making the above-described semiconductor device 10. First, the semiconductor substrate 12, including the active region 13, is provided. Next the gate dielectric 20 is deposited on the semiconductor substrate 12. Then, the gate electrode 18 is deposited on the gate dielectric 20. Together, the gate dielectric 20 and the gate electrode 18 form a vertical stack on the semiconductor substrate 12 characteristic of a FET. Next, the semiconductor substrate 12 is doped to form the source 14 and the drain 16. Afterwards, layers of first, second, third and fourth dielectric materials are deposited on the gate electrode 18. Next, the first, second, third and fourth layers are anisotropically etched to form graded dielectric constant spacers 24 on the sidewalls of the vertical stack.

Although the graded dielectric constant spacers 24 are shown with four layers, it should be understood that the graded dielectric constant spacers 24 may have more or less layers. In one embodiment, the graded dielectric constant spacers 24 have at least two layers of at least one of a first dielectric material and a second dielectric material. One of the at least two layers of the first dielectric material and the second dielectric material is a high-K dielectric material.

In one embodiment, the dielectric material is deposited by chemical vapor deposition (CVD). The CVD method may be any appropriate CVD method known in the art. For example, the CVD method may be ALD, PECVD, RTCVD or LPCVD. In one embodiment, the dielectric material is deposited by a nitridation method. In one embodiment, the dielectric materials are deposited in the same apparatus. In one embodiment, the dielectric materials are deposited sequentially by controlling the supply of precursor materials to the CVD apparatus.

In an alternative embodiment, the layers may be deposited one at a time, in separate apparatuses. This alternative embodiment allows for different deposition methods to be used for the respective layers.

The method of making the semiconductor device 10 having graded dielectric constant spacers 24 is now described in detail with reference to FIGS. 2–7. FIG. 7 is a flow diagram 50 schematically presenting the steps of making the semiconductor device 10 of the present invention.

Figure 2:
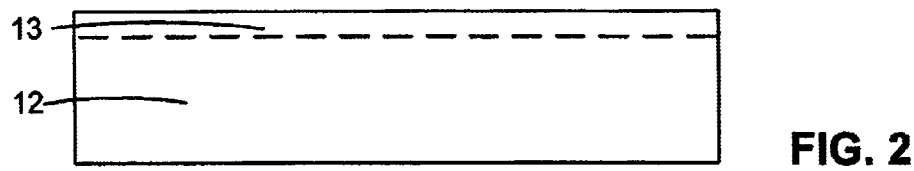
FIG. 2 is a schematic cross-sectional view of a semiconductor substrate with the semiconductor device at an intermediate stage of manufacture in accordance, with the present invention.

In the first step of the method of the present invention, shown in FIG. 7 as Step S52, the semiconductor substrate 12 is provided. The semiconductor substrate 12 is shown in FIG. 2, for example. The semiconductor substrate 12 may be any appropriately selected semiconductor substrate known in the art, as described above. The semiconductor substrate 12 may be subjected to implants to provide an active region 13 in the semiconductor substrate 12 as is known in the art. For instance, boron or indium may be implanted to form a p-type region or channel for an n-type device and phosphorous or arsenic may be implanted to form an n-type region or channel for a p-type device. An exemplary range of concentration of these dopings is between $1 \times 10^{18}$ and $5 \times 10^{18}$ atoms/cm$^3$ for a p-type channel 22. The resulting structure is shown in FIG. 2.

Next in Step S54, the gate dielectric 20 is formed on the semiconductor substrate 12. The gate dielectric 20 is formed of a dielectric material having a dielectric constant greater than the dielectric constant of $SiO_2$, for example, $Al_2O_3$. The gate dielectric 20 of $Al_2O_3$ may be deposited to a thickness between 50 and 100 angstroms (Å). Then, the gate electrode 18 is formed on the gate dielectric 20. Initially, an undoped layer of polysilicon may be deposited on the gate dielectric 20. The polysilicon layer of the gate electrode 18 may be deposited to between about 1000 and 1500 angstroms (Å) thick. Following the deposition of the polysilicon layer, it may be polished back to a thickness of between 800 and 1200 angstroms (Å) thick. Next, the polysilicon layer is patterned to form the gate electrode 18. Following the patterning of the gate electrode 18, an implantation step may be done at this time to implant the polysilicon of the gate electrode 18. Alternatively, the polysilicon layer may be N+ predoped, for example.

Next, the semiconductor substrate 12 may be subjected to implants to produce the source 14 and the drain 16. The source 14 and the drain 16 may be formed by a main perpendicular implant. The main perpendicular implant is a relatively high energy, high concentration implant which is capable of producing the source 14 and the drain 16. Either boron, arsenic, or phosphorous may be used alone or in any combination as the dopant atoms. An exemplary range of implant dose of the perpendicular implant is between $1 \times 10^{15}$ and $2 \times 10^{15}$ atoms/cm$^2$. An exemplary range of concentration of these dopings is between $1 \times 10^{20}$ and $2 \times 10^{20}$ atoms/cm$^3$ for the source 14 and the drain 16. The dopants may be selected from other dopant materials known in the art.

Although the source 14 and the drain 16 are shown as main implantation regions, it should be understood that extension implantation may be done in order to form extension regions as is known in the art. It should be understood that the formation of the source 14 and the drain 16 may take place before the formation of the gate electrode 18.

Figure 3:
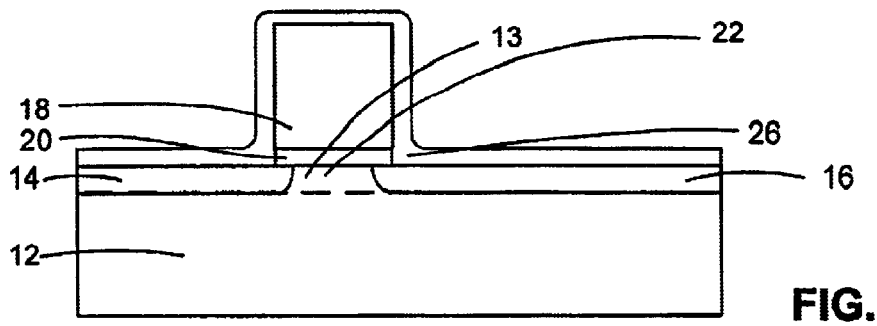
FIG. 3 is a schematic cross-sectional view of a semiconductor substrate with the semiconductor device at another intermediate stage of manufacture in accordance with the present invention.

Referring now to FIG. 3, the first layer 26 is formed on the gate electrode 18, the sidewalls of the gate dielectric 20 and the surface of the semiconductor substrate 12 in Step S56. The first layer 26 is formed of a dielectric material having a dielectric constant equal to or greater than the dielectric constant of the gate dielectric 20. The first layer 26 may be formed by a technique further described below. In an exemplary embodiment, the first layer 26 is $Al_2O_3$. The first layer 26 may have a thickness of between 200 and 400 angstroms (Å).

Figure 4:
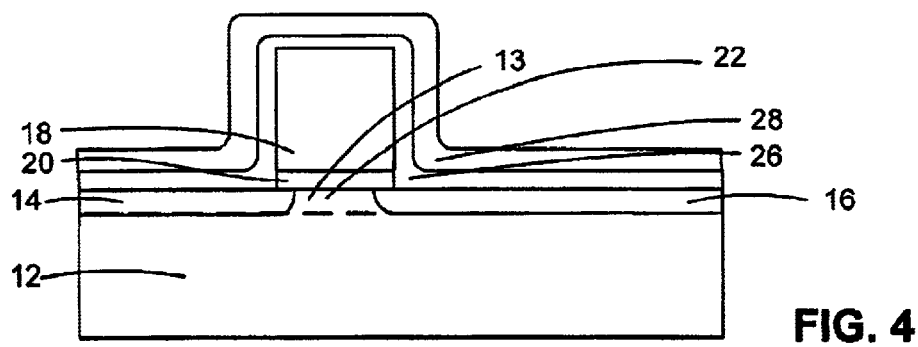
FIG. 4 is a schematic cross-sectional view of a semiconductor substrate with the semiconductor device at another intermediate stage of manufacture in accordance with the present invention.

Now referring to FIG. 4 and Step S58, the second layer 28 is formed on the first layer 26. The second layer 28 is formed of a dielectric material having a dielectric constant less than the dielectric constant of the preceding layer, i.e., the first layer 26. The second layer 28 may be formed of a $Si_3N_4$ material, for example. The second layer 28 may be formed by a nitridation process as described below. The second layer 28 may have a thickness of between 200 and 400 angstroms (Å), for example.

Figure 5:
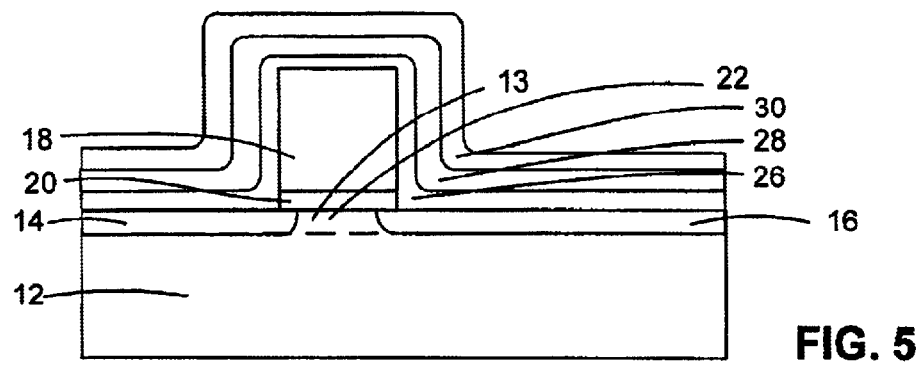
FIG. 5 is a schematic cross-sectional view of a semiconductor substrate with the semiconductor device at another intermediate stage of manufacture in accordance with the present invention.

With reference to FIG. 5, the third layer 30 is formed on the second layer 28 in Step S60. The third layer 30 is formed of a dielectric material having a dielectric constant less than the dielectric constant of the preceding layer, i.e., the second layer 28. The third layer 30 may be formed of a $SiO_xN_y$ material, for example. The third layer 30 may be formed by a nitridation process as described below. The third layer 30 may have a thickness of between 200 and 400 angstroms (Å), for example.

Figure 6:
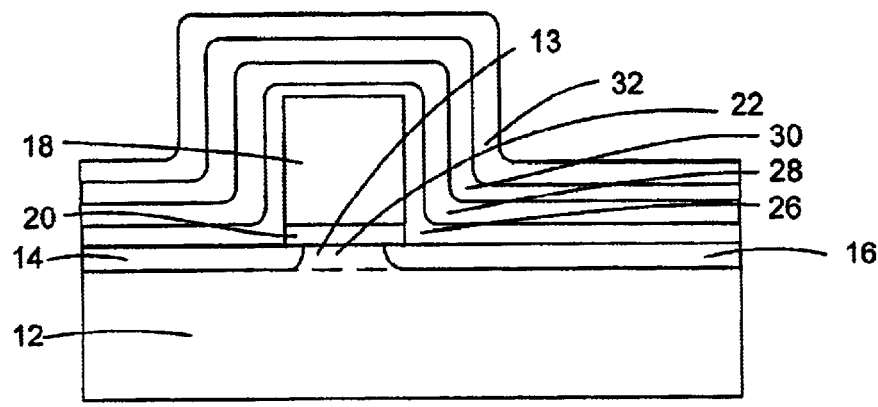
FIG. 6 is a schematic cross-sectional view of a semiconductor substrate with the semiconductor device at another intermediate stage of manufacture in accordance with the present invention.
Figure 7:
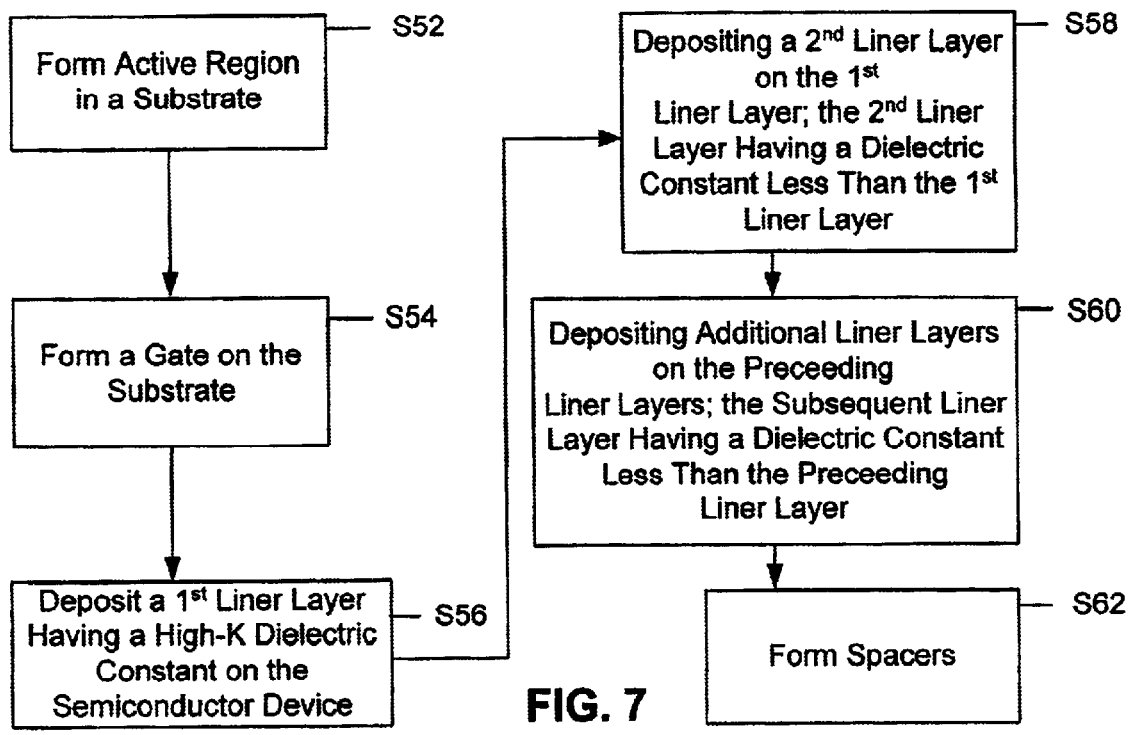
FIG. 7 is a schematic flow digram showing the basic steps in a process of making a semiconductor device in accordance with the present invention.

Next as shown in FIG. 6, the fourth layer 32 is formed on the third layer 30. The fourth layer 32 is formed of a dielectric material having a dielectric constant less than the dielectric constant of the preceding layer, i.e., the third layer 30. The fourth layer 32 may be formed of a $SiO_2$ material, for example. The fourth layer 32 may be formed by a CVD process as described below. The fourth layer 32 may have a thickness of between 200 and 400 angstroms (Å), for example.

In this exemplary embodiment aluminum oxide, silicon nitride, silicon oxynitride and $SiO_2$ are the fist, second, third and fourth dielectric materials. When the aluminum is supplied, the aluminum is in the form of an aluminum-containing gas such as trimethyaluminum (TMA), $Al(CH_3)_3$. When the nitride for the second layer 28 is supplied, the nitride is in the form of ammonia gas, $NH_3$. When the nitride for the third layer 30 is supplied, the nitride is in the form of nitric oxide, NO. Oxygen is also supplied in the gaseous form. Since the first layer 26 is to be aluminum oxide, the aluminum-containing gas and the oxygen are first provided to the CVD apparatus. When a suitable thickness of aluminum oxide has been deposited, the flow of the aluminum-containing gas is stopped, and a flow of $NH_3$ is provided to the CVD apparatus. When a suitable thickness of $Si_3N_4$ has been deposited, the flow of the $NH_3$ gas is stopped, and a flow of NO is provided to the CVD apparatus, When a suitable thickness of $SiO_xN_y$ has been deposited, the flow of the NO is stopped, and the flow of oxygen gas is provided to the CVD apparatus, and continued until a suitable thickness of $SiO_2$ is deposited. This process of layer deposition may be continued until a suitable, selected number of layers of desired thickness have been deposited. In the exemplary embodiment, four layers are deposited. It should be understood that the layers 26, 28, 30 and 32 may be deposited in separate apparatuses. Depositing nitride using conventional RTA techniques may also form the thin second layer 28 of nitride.

Subsequently, connections such as word lines may be formed using conventional techniques in order to establish electrical connections between the semiconductor device and other nodes (such as an I/O pad or Vss), the source 14 or the drain 16 of the device, as well as, a power supply or a ground, if desired The formation of the connections is not shown.

Next in Step S62, the layers 26, 28, 30 and 32 are anisotropically etched with a suitable etchant. The layers 26, 28, 30 and 32 are etched down to expose the top of the gate electrode 18 and lateral surfaces of the semiconductor substrate 12, leaving the graded dielectric constant spacers 24 shown in FIG. 1. The graded dielectric constant spacers 24 may extend from the surface of the semiconductor substrate 12 to heights of between 800 and 1200 angstroms (Å).

After the formation of the graded dielectric constant spacers 24, the semiconductor device 10 is subjected to rapid thermal annealing (RTA). Exemplary RTA may be performed for between 5 and 15 seconds at a temperature of 1020–1050° C.

In the detailed description that follows of the subsequent exemplary embodiments, similar components will have a similar reference numeral to components described in the preceding embodiment in the 100 or 200 series. For the sake of brevity, common components in subsequent embodiments may neither be shown nor described.

Figure 8:
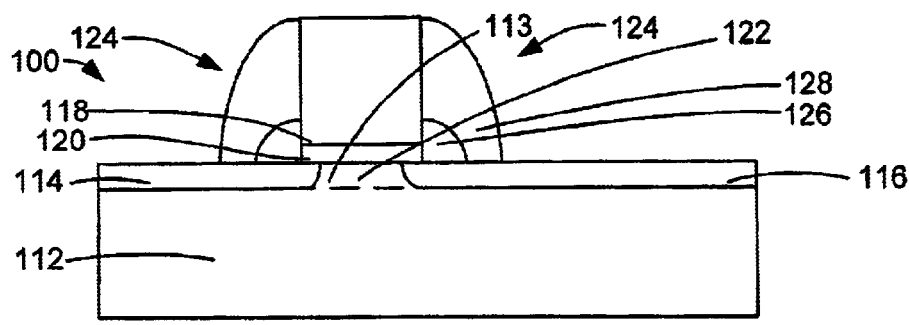
FIG. 8 is a schematic cross-sectional view of a semiconductor substrate with another embodiment of the semiconductor device in accordance with the present invention.
Figure 9:
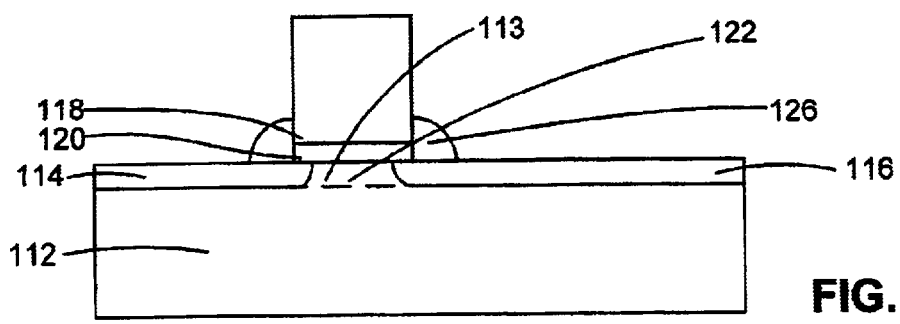
FIG. 9 is a schematic cross-sectional view of a semiconductor substrate with the embodiment of the semiconductor device shown in FIG. 8 at an intermediate stage of manufacture in accordance with the present invention.
Figure 10:
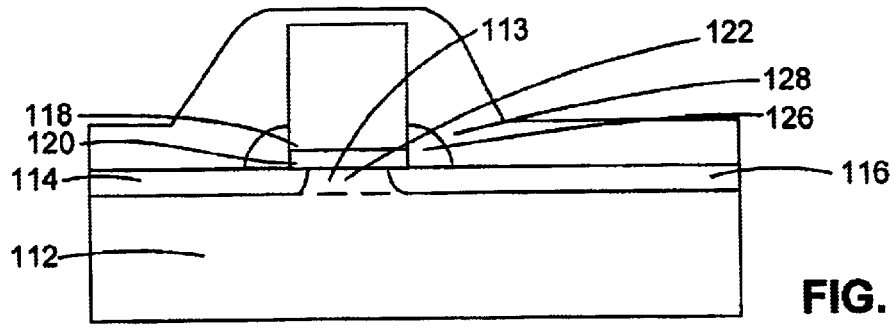
FIG. 10 is a schematic cross-sectional view of a semiconductor substrate with the embodiment of the semiconductor device shown in FIG. 8 at another intermediate stage of manufacture in accordance with the present invention.

FIGS. 8–10 show another exemplary embodiment of a semiconductor device generally designated as 100 including graded dielectric constant spacers generally designated as 124. The exemplary semiconductor device 100 is a FET formed in a characteristic vertical stack on a semiconductor substrate 112. The graded dielectric constant spacers 124 are formed from a recessed spacer 126 and a secondary spacer 128. The recessed spacer 126 is formed on the sidewalls of the gate dielectric 126 and on an upper surface of the semiconductor substrate 112. The recessed spacer 126 extends from the upper surface of the semiconductor substrate 112 partially up the sidewall of a gate electrode 118. The secondary spacer 128 is formed on the recessed spacer 126, on a remaining exposed sidewall of the gate electrode 118 and an upper surface of the semiconductor substrate 112. The graded dielectric constant spacers 124 include and/or are formed from sub-layers of a first dielectric material and a second dielectric material on the vertical stack. Together the sub-layers form the graded dielectric constant spacers 124 having at least one sub-layer of the first dielectric material and the second dielectric material. The first dielectric material is a high-K dielectric material relative to $SiO_2$. In this exemplary embodiment, the second dielectric material is a dielectric material having a dielectric constant less than the dielectric constant of the first dielectric material. The graded dielectric constant spacers 124 move interfaces of the layers in which electrons become entrapped away from the interfaces of a gate dielectric 120 and the graded dielectric constant spacers 124. Thus, the graded dielectric constant spacers 124 are an improved spacer for semiconductor devices with high-K dielectrics.

The gate electrode 118, the source 114 and the drain 116 are formed in a process similar to the one described above in Steps S54–S56. Next, a first layer 126 is formed on the gate electrode 118, on the sidewalls of the gate dielectric 120 and on the surface of the semiconductor substrate 112. The first layer 126 may be formed as described above and has a dielectric constant equal to or greater than the gate dielectric 120. In an exemplary embodiment, the first layer 126 is of aluminum oxide. The first layer 126 may have a thickness of between 100 and 200 angstroms (Å). Next, the first layer 126 is anisotropically etched with a suitable echant. The first layer 126 is over-etched and reduced in size, leaving the recessed spacer 126 shown in FIG. 9.

Next, the second layer 128 of a dielectric material having a dielectric constant less than the dielectric constant of the preceding layer, i.e., the recessed spacer 126, is formed on the recessed spacer 126. The second layer 128 may be of a nitride material, for example. The second layer 128 may be formed by a nitridation process as described above. The second layer 128 may have a thickness of between 700 and 1000 angstroms (Å), for example. The resulting structure is shown in FIG. 10.

Next, the second layer 128 is anisotropically etched with a suitable echant. The second layer 128 is reduced in size, leaving the graded dielectric constant spacers 124 shown in FIG. 8. The graded dielectric constant spacers 124 may extend from the surface of the semiconductor substrate 112 to a height of between 800 and 1200 angstroms (Å).

Figure 11:
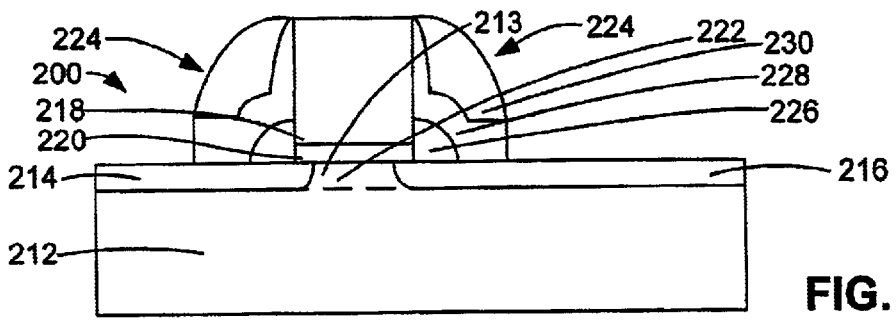
FIG. 11 is a schematic cross-sectional view of a semiconductor substrate with yet another embodiment of a semiconductor device in accordance with the present invention.

Another exemplary embodiment of the semiconductor device is shown generally designated as 200 in FIG. 11. The semiconductor device 200 includes graded dielectric constant spacers 224 having L-shape and murre L-shape sub-layers. The graded dielectric constant spacers 224 move the interface in which the electrons may become entrapped away from the interface of a gate dielectric 220 and the graded dielectric constant spacers 224 as described above. Thus, graded dielectric constant spacers 224 are an improved spacer for semiconductor devices with high-K dielectrics.

Following the formation of a gate as described above, a recessed spacer 226 of $Si_3N_4$, for example, is formed in a process similar to the one described above. Next, a second layer 228 is formed on the recessed spacer 226. The second layer 228 is formed of a dielectric material having a dielectric constant less than the dielectric constant of the preceding layer, i.e., the recessed spacer 226. The second layer 228 may be of a $SiO_xN_y$ material, for example. The second layer 228 may be formed by a nitradation process as described above. The second layer 228 may have a thickness of between 200 and 400 angstroms (Å), for example.

Figure 12:
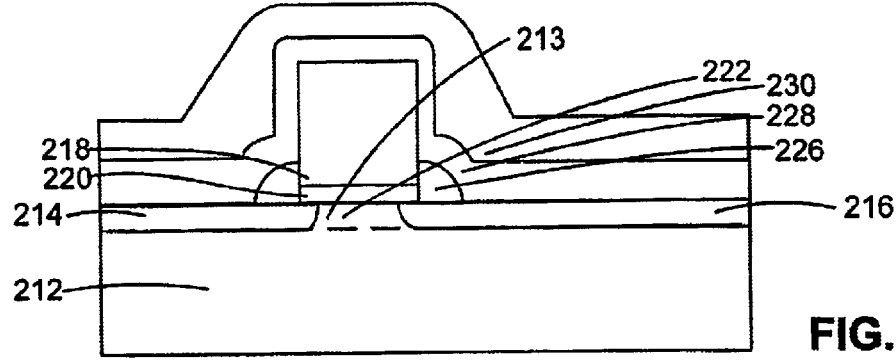
FIG. 12 is a schematic cross-sectional view of a semiconductor substrate with the embodiment of the semiconductor device shown in FIG. 11 at an intermediate stage of manufacture in accordance with the present invention.

Next, a third layer 230 is formed on the second layer 228. The third layer 230 is formed of a dielectric material having a dielectric constant less than the dielectric constant of the preceding layer, i.e., the second layer 228. The third layer 230 may be of a $SiO_2$ material, for example. The third layer 230 may be formed by a CVD process as described above. The third layer 230 may have a thickness of between 500 and 600 angstroms (Å), for example. The resulting structure is shown in FIG. 12.

Figure 13:
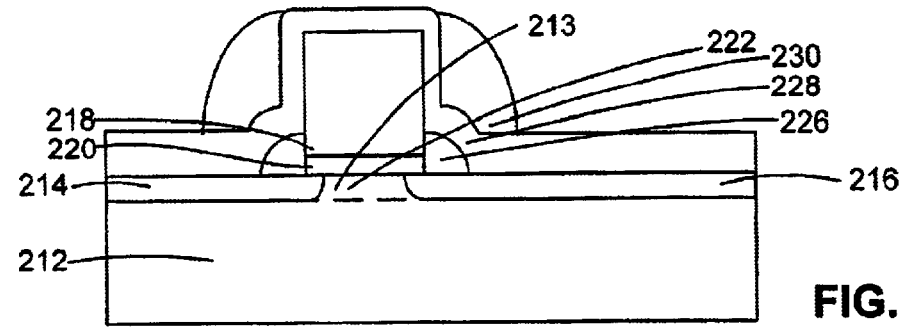
FIG. 13 is a schematic cross-sectional view of a semiconductor substrate with the embodiment of the semiconductor device shown in FIG. 11 at another intermediate stage of manufacture in accordance with the present invention.

Next, the third layer 230 is anisotropically etched with a suitable echant The third layer 230 is reduced in size, leaving a spacer 230 as shown in FIG. 13. Next, the second layer 228 and the third layer 230 are anisotropically etched with a suitable echant. The second layer 228 and the third layer 230 are reduced in size, leaving the graded dielectric constant spacers 224 shown in FIG. 11. The second layer 228 is formed into an L-shape and a mirror L-shape. The graded dielectric constant spacers 224 may extend from the surface of a semiconductor substrate 212 to a height of between 800 and 1200 angstroms (Å).

The graded dielectric constant spacers 24, 124 and 224 (FIG. 1 and FIG. 11) are depicted with discrete layers. When the layers (i.e., layers 26, 28, 30 and 32; layers 126 and 128 and layers 226, 228 and 230) are deposited, the layers are discrete as shown in FIGS. 3–6, FIG. 10 and FIG. 12, respectively, for example. Following the step of annealing to activate the source (e.g., 14, 114 and 214) and the drain (e.g., 16, 116, and 216), the respective dielectric materials in the layers may combine or react with each other to form a reaction product, which is a composite or hybrid material. In other words, to some degree, each of the discrete layers may blend into the adjacent layers so that the boundary from one layer to the next is indeterminate. The various layers shown in the drawings are depicted with discrete boundaries, but this may not be the case in actual practice. Thus, while the graded dielectric constant spacers (e.g., 24, 124 and 224) are shown as comprising discrete layers as a result of the annealing step, to some degree, the layers may lose their discrete character and blend together, at least at the interfaces between the layers.

The present invention enables further device scaling without adverse impact on device performance. Additionally, the graded dielectric constant spacers (e.g., 24, 124 and 224) with a relatively high-K electrical equivalence that decreases in a direction away from the gate dielectrics (e.g., 20, 120 and 220) improves the device operation. Specifically, the increased dielectric constant at the interface with the gate dielectric increases the likelihood that the electrons in the gate electrode (e.g., 18, 118 and 218) will tunnel through the gate dielectric material to the semiconductor substrate (e.g., 12, 112 and 212). Electrons that do tunnel into the graded dielectric constant spacers (e.g., 24, 124 and 224) will become entrapped in an interface of a layer away from the interface of the gate dielectric (e.g., 20, 120 and 220). Thus, the fixed charge in the graded dielectric constant spacers (e.g., 24, 124 and 224) will not adversely affect device performance.

Although particular embodiments of the invention have been described in detail, it is understood that the invention is not limited correspondingly in scope, but includes all changes, modifications and equivalents coming within the spirit and terms of the claims appended hereto. Additionally, although the flow diagram of FIG. 7 shows a specific procedural order, it is understood that the procedural order may differ from that which is depicted. For example, the procedural order of two or more blocks may be reordered relative to the order shown. Also, two or more blocks shown in succession in FIG. 7 may be processed concurrently or with partial concurrence.

What is claimed is:

1. A method of fabricating a semiconductor device formed on a semiconductor substrate having an active region, the method comprising the steps of:

forming a gate dielectric layer on the semiconductor substrate;

forming a source and a drain within the active region of the semiconductor substrate;

forming a gate electrode on the gate dielectric layer wherein the gate electrode defines a channel interposed between the source and the drain; and forming graded dielectric constant spacers on sidewalls of the gate electrode, sidewalls of the gate dielectric layer and portions of an upper surface of the semiconductor substrate, wherein the dielectric constant of the graded dielectric constant spacers decreases in value in a direction away from the gate dielectric layer.

2. The method according to claim 1, wherein the step of forming graded dielectric constant spacers further includes the steps of:

forming a first layer on the sidewalls of the gate electrode, the sidewalls of the gate dielectric and the portions of the upper surface of the semiconductor substrate;

forming a second layer on the first layer;

forming a third layer on the second layer; and forming a fourth layer on the third layer, wherein the first layer has a dielectric constant greater than $SiO_2$ and each of the second, third and fourth layers has a dielectric constant less than the dielectric constant of the preceding layer.

3. The method of claim 2, further including the step of:

forming the first layer of one or more of $Al_2O_3$, $HfO_2$, $ZrO_2$, $Ta_2O_5$, $BaTiO_3$, $TiO_2$, $CeO_2$, BST ($Ba_{1-x}Sr_xO_3$), PZN ($PbZn_xNb_{1-x}O_3$) and PST ($PbSc_xTa_{1-x}O_3$).

4. The method of claim 3, further including the step of:

forming the second layer of one or more of $SiO_2$, $Si_3N_4$, $SiO_xN_y$, $Al_2O_3$, $HfO_2$, $ZrO_2$, $Ta_2O_5$, $BaTiO_3$, $TiO_2$, $CeO_2$, BST ($Ba_{1-x}Sr_xO_3$), PZN ($PbZn_xNb_{1-x}O_3$) and PST ($PbSc_xTa_{1-x}O_3$).

5. The method of claim 4, further including the step of:

forming subsequent layers of one or more of $SiO_2$, $Si_3N_4$, $SiO_xN_y$, $Al_2O_3$, $HfO_2$, $ZrO_2$, $Ta_2O_5$, $BaTiO_3$, $TiO_2$, $CeO_2$, BST ($Ba_{1-x}Sr_xO_3$), PZN ($PbZn_xNb_{1-x}O_3$) and PST ($PbSc_xTa_{1-x}O_3$).

* * * * *

UNITED STATES PATENT AND TRADEMARK OFFICE
CERTIFICATE OF CORRECTION

PATENT NO. : 6,764,966 B1
DATED : July 20, 2004
INVENTOR(S) : En et al.

Page 1 of 1

It is certified that error appears in the above-identified patent and that said Letters Patent is hereby corrected as shown below:

Column 1,
Line 32, replace "featured" with -- feature --.

Column 2,
Line 3, remove "in".

Column 3,
Line 50, replace "layers" with -- layer --.
Line 58, replace "accordance," with -- accordance --.

Column 4,
Line 9, replace "digram" with -- diagram --.

Column 5,
Line 12, replace "sub-layer" with -- sub-layers --.

Column 7,
Line 18, table 1, replace "BasTiO$_3$" with -- BaTiO$_3$ --.

Column 8,
Line 6, replace "Next" with -- Next, --.

Column 10,
Line 2, replace "fist" with -- first --.
Line 17, replace "apparatus" with -- apparatus, --.

Signed and Sealed this

Sixteenth Day of November, 2004

JON W. DUDAS
*Director of the United States Patent and Trademark Office*